United States Patent [19]

Sakamoto

[11] 3,978,411

[45] Aug. 31, 1976

[54] SWEEP OUTPUT GENERATOR HAVING A FREQUENCY MODULATED LOCAL OSCILLATOR FOR THE STATION SELECTOR OF A TELEVISION RECEIVER

[75] Inventor: Yoichi Sakamoto, Takatsuki, Japan

[73] Assignee: Matsushita Electric Industrial Co., Ltd., Osaka, Japan

[22] Filed: Nov. 26, 1974

[21] Appl. No.: 527,271

[30] Foreign Application Priority Data

| Nov. 30, 1973 | Japan | 48-135528 |
|---|---|---|
| Nov. 30, 1973 | Japan | 48-135529 |
| Nov. 30, 1973 | Japan | 48-135530 |
| Nov. 30, 1973 | Japan | 48-135531 |
| Nov. 30, 1973 | Japan | 48-135532 |

[52] U.S. Cl. ............................ 325/421; 325/470; 331/178
[51] Int. Cl.² ........................................ H04B 1/34
[58] Field of Search ............... 331/1 A, 2, 11, 18, 331/178, 179; 325/421–423, 464, 469, 470, 465, 471; 334/15, 16

[56] References Cited
UNITED STATES PATENTS

| 3,588,706 | 6/1971 | Sakai | 325/422 |
|---|---|---|---|
| 3,798,553 | 3/1974 | Sakamoto | 325/421 |
| 3,818,353 | 6/1974 | Sakamoto | 325/423 |
| 3,822,405 | 7/1974 | Sakamoto | 325/464 |
| 3,845,393 | 10/1974 | Basset | 325/464 |
| 3,846,707 | 11/1974 | Sakamoto et al. | 325/470 |

*Primary Examiner*—Benedict V. Safourek
*Attorney, Agent, or Firm*—Stevens, Davis, Miller & Mosher

[57] ABSTRACT

A sweep output generator in which an a-c voltage of small amplitude is superimposed upon a sweep voltage applied to a variable reactance element of a local sweep voltage controlled oscillator for sweeping the local oscillator frequency and also for frequency modulation. The frequency modulated local sweep oscillator output and the output of a second voltage controlled oscillator are coupled to a mixer to obtain an intermediate frequency signal. The intermediate frequency signal is frequency demodulated through a frequency discriminator, whose output is in turn integrated to obtain a sweep output voltage of a characteristic similar to the normalized oscillation frequency versus impressed voltage characteristic of the local oscillator.

4 Claims, 7 Drawing Figures

SWEEP OUTPUT GENERATOR HAVING A FREQUENCY MODULATED LOCAL OSCILLATOR FOR THE STATION SELECTOR OF A TELEVISION RECEIVER

This invention relates to sweep output generators for the station selector of television receivers.

In a well-known automatic tuner of the type in which a sweep voltage is impressed upon a variable capacitance diode for sweeping the tuning frequency with variation of the variable capacitance of the variable capacitance diode, a predetermined intermediate frequency signal is produced when a given frequency is tuned in, and upon detection of this intermediate frequency signal the frequency sweeping is stopped. The capacitance C of the variable capacitance diode used in this tuner is related to the contact potential difference $\phi_D$ and reverse impressed voltage $V_R$ such that $$C \alpha \ (\phi_D + V_R)^{-1/n}$$

The tuning frequency $f$ is a function of $C$, and in the case of a single tuned circuit it is $$f = \frac{1}{2\pi \sqrt{LC}}$$

so that the characteristic of the tuning frequency $f$ versus the impressed voltage $V_R$ is not linear. Therefore, it is difficult to obtain a linear display of the received frequency or a digital display of the received channel from the variable capacitance diode impression voltage.

An object of the present invention is to provide a frequency sweeping circuit for sweeping the tuning frequency or oscillation frequency by impressing a sweep voltage or current upon a variable reactance element. The circuit is capable of producing a sweep output voltage having a characteristic similar to that of a normalized local oscillator frequency versus impressed voltage or current characteristic to enable linear display of the received frequency or digital display of the received channel through linear division of the sweep output voltage. The circuit also provides electronic tuning by an arrangement which compares the sweep output voltage and a digitally controlled reference voltage and stops the sweeping when the sweep frequency reaches a desired channel frequency to thereby tune in that channel.

Another object of the invention is to provide an inexpensive and accurate digital-to-analog converter for the sweep voltage generator, which converter is so constructed as to produce a stair-case voltage from a rectangular voltage added to an integrator, to stop the sweeping according to a station selection command digital signal and to hold the voltage at the instant of the stop of the sweeping for a required period.

The above and other objects, features and advantages of the invention will become more apparent from the following description taken in conjunction with the accompanying drawings, in which.

Figure 1:
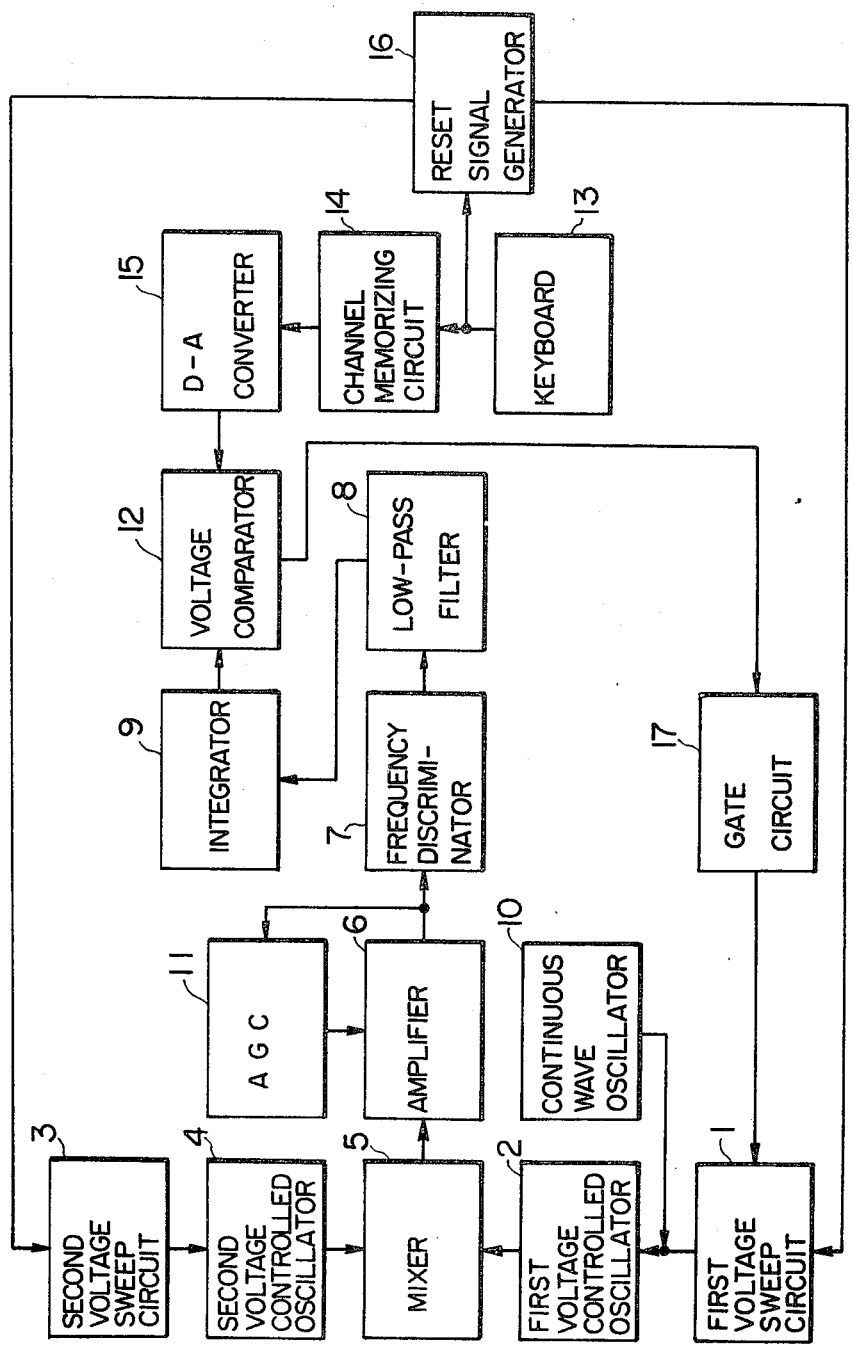
FIG. 1 is a block diagram showing an embodiment of the sweep output generator according to the invention.

Referring now to FIG. 1 showing an embodiment of the invention, designated at 1 is a first voltage sweep circuit, at 2 a first voltage controlled oscillator (VCO) constituting the local oscillator of the tuner, at 3 a second voltage sweep circuit, at 4 a second voltage controlled oscillator (VCO), at 5 a mixer combining the outputs of the first and second voltage controlled oscillators (VCO) to obtain an intermediate frequency signal, at 6 an amplifier amplifying the intermediate frequency signal produced from the mixer 5, at 7 a frequency discriminator, at 8 a low-pass filter (LPF), at 9 a circuit for amplifying and integrating the output of the low-pass filter 8, at 10 a continuous wave oscillator, and at 11 an AGC circuit acting such as to maintain the amplitude of the output of the amplifier 6 constant. The voltage sweep circuit here may be replaced with a current sweep circuit, and also the voltage controlled oscillator may be replaced with a current controlled oscillator.

Figure 2:
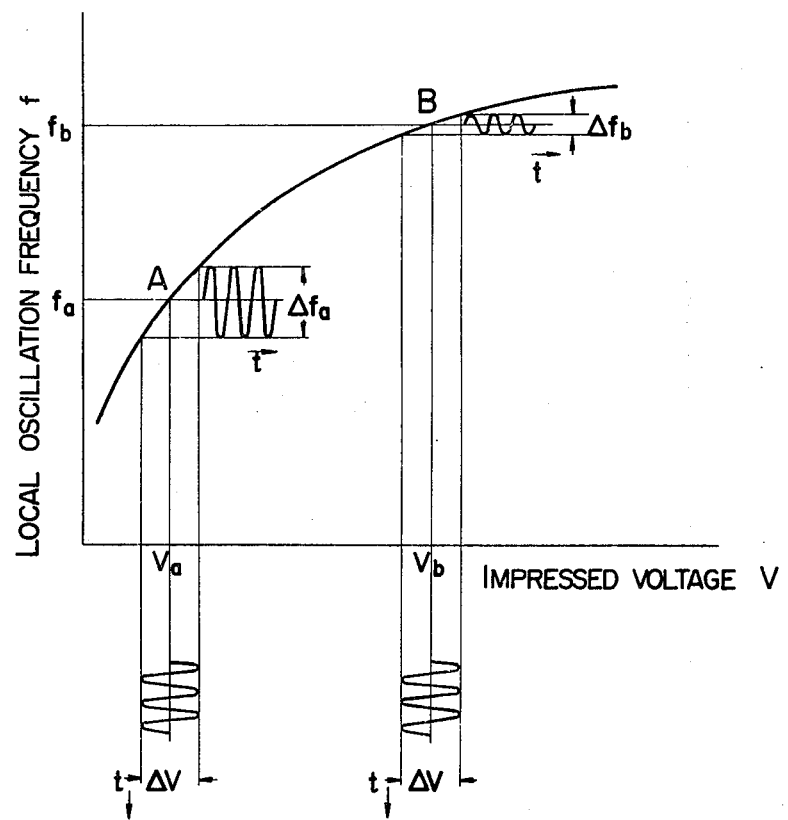
FIGS. 2 and 3 are graphs for illustrating the characteristics of the sweep output generator.

FIG. 2 shows the frequency characteristic of the local oscillator. Indicated at $V_a$ and $V_b$ are voltages impressed upon the first and second voltage controlled oscillators 2 and 4, which voltages are selected such that the difference between the oscillation frequencies of the first and second voltage controlled oscillators 2 and 4 in the still state of the first and second voltage sweep circuits 1 and 3 is the intermediate frequency. At the respective points A and B, the slopes of the characteristic are represented by $\Delta f_a/\Delta V$ and $\Delta f_b/\Delta V$ where $\Delta V$ is the amplitude of the superimposed constant amplitude continuous wave of the continuous wave oscillator 10 and is sufficiently small; that is, they are values of the differential coefficient $\Delta f/\Delta V$ of the local oscillator frequency $f$ with respect to the impressed voltage $V$ at the respective points A and B.

Figure 3:
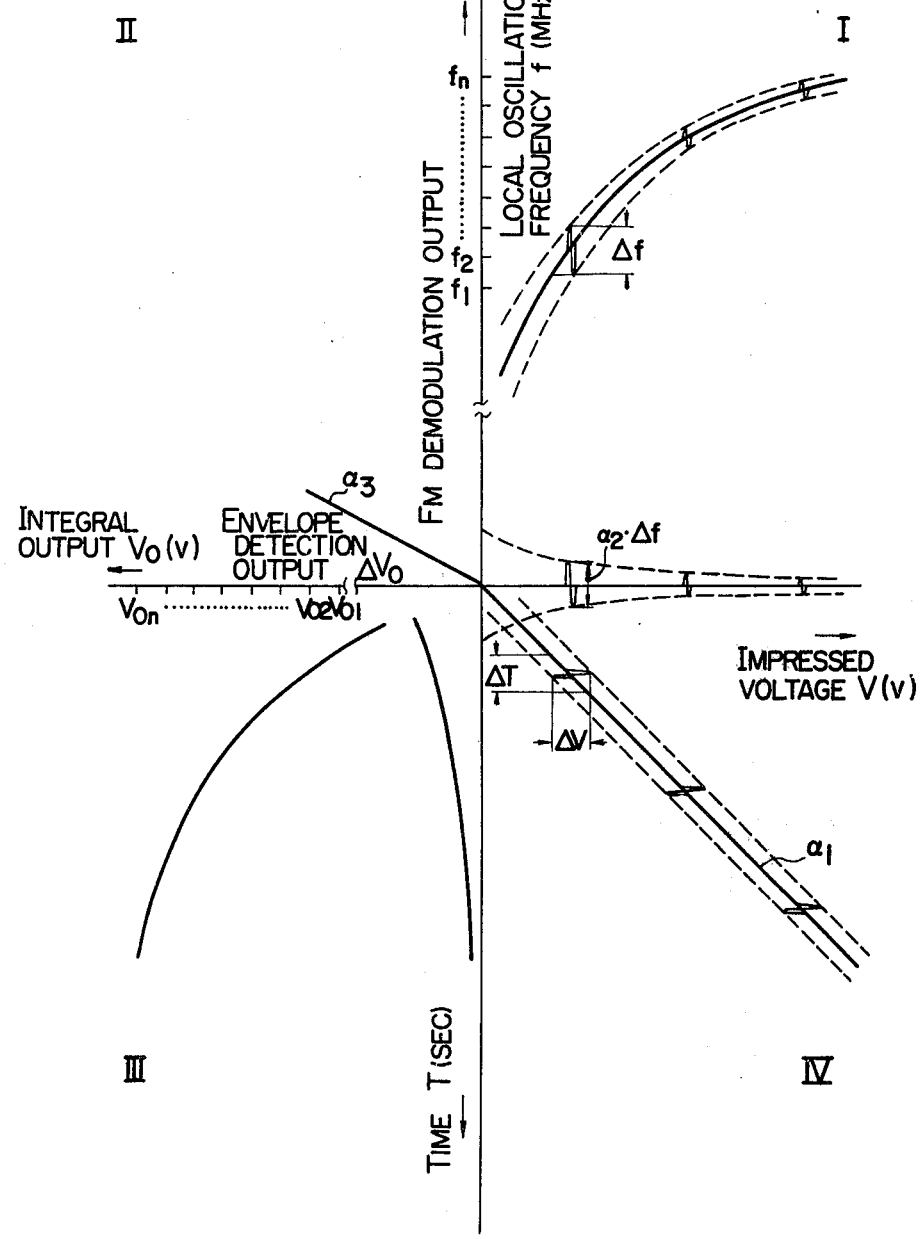

Now, the case of linearly sweeping the impressed voltage V with respect to time T is considered. FIG. 3 shows the relation between impressed voltage V and time T. The impressed voltage being swept is represented by the straight line, with the envelope of the superimposed continuous wave V being indicated by dashed lines. At this time, the local oscillation frequency signal is frequency modulated by $\Delta f$. This frequency modulated signal is produced from the voltage controlled oscillator 2 in FIG. 1 and is coupled to the mixer 5. If there is perfect tracking between the outputs of the first and second voltage controlled oscillators 2 and 4 when the impressed voltage is being swept, a frequency demodulated wave is obtained at the frequency discriminator. If the sweeping of the impressed voltage V is made at a constant slope 1 with respect to time $T$, $$\Delta V = \alpha_1 \Delta T$$

and hence $$\Delta f = \frac{df}{dV} \cdot \alpha_1 \cdot \Delta T$$

Denoting the sensitivity of the frequency discriminator by $\alpha_2$ and the sensitivity of the envelope detection by $\alpha_3$, envelope detection output $\Delta Vo$ is shown as;

$$\Delta Vo = \alpha_1 \cdot \alpha_2 \cdot \alpha_3 \cdot \frac{df}{dV} \cdot \Delta T$$

Hence $$\frac{dVo}{dT} = \alpha \frac{df}{dV}$$

where $\alpha$ is constant and is equal to $\alpha_1 \cdot \alpha_2 \cdot \alpha_3$. This means that the curve obtained by normalizing the $f$–$V$ characteristic by $1/\alpha$ is converted into a form similar to the $V_0$–$T$ characteristic. In other words, if the sweep voltage characteristic is represented by the curve of the integral output $V_0$ obtained by integrating the envelope detection output $\Delta V_0$ with respect to time, this characteristic is similar to the normalized characteristic obtained by normalizing the local oscillator frequency versus impressed voltage characteristic by $1/\alpha$.

Thus, it will be seen that by graduating the $V_0$-axis with $V_{01}, V_{02}, \ldots, V_{0n}$ in correspondence to the respective graduations $f_1, f_2, \ldots, f_n$ on the $f$-axis for display with a voltmeter, a linear display of the reception frequency can be obtained.

The sweep output voltage $V_0$, which corresponds to the output of the integrating circuit 9 in FIG. 1, is coupled to one input terminal of a voltage comparator 12. At the other input terminal of the voltage comparator 12, a channel number keyed in a keyboard 13 is memorized; for instance, the output of a digital-to-analog converter 15 controlled by a channel memorizing circuit 14 consisting of a shift register is coupled to the other input of voltage comparator 12. The output of the digital-to-analog converter corresponds to the local oscillation frequency for each channel for comparison with the integral output $V_0$ shown in FIG. 3. When a channel number is keyed in the keyboard 13, it is memorized in the channel memorizing circuit 14, while simultaneously a reset signal generator 16 is adapted to produce a reset signal to reset the first and second voltage sweep circuits 1 and 3 for starting the voltage sweep. When the sweep output voltage $V_0$ of the aforementioned characteristic coincides with the output voltage of the digital-to-analog converter 15, the voltage comparator 12 produces a sweep stop signal to close a gate circuit 17 for stopping the sweep in the voltage sweep circuit 1. By holding the voltage at this instant and applying it to the variable capacitance diode serving as tuning element of the tuner, the channel memorized in the channel memorizing circuit 14 may be tuned in. Of course, the hold voltage thus obtained at the time of the stopping of the sweep may be coupled to an auxiliarily provided automatic tuning means as mentioned in connection with the prior art or an ordinary AFC circuit for accurately tuning in the broadcast frequency. The display of the channel number may be achieved as a digital display by coupling the output of the channel memorizing circuit 14 through a decoder to a figure discharge tube or the like. In the case of providing an AFC, the output of the intermediate frequency amplifier 6 may be coupled through a frequency discriminator to a low-pass filter, and the d-c output of the low-pass filter may be coupled through a gate circuit for superimposition upon the output voltage of the first voltage sweep circuit 1. In this case, the gate is adapted to be rendered conductive by a detection signal produced when the stoppage of voltage sweeping in the first voltage sweep circuit 1 is detected, and the AFC voltage is coupled to the variable reactance element in the first voltage controlled oscillator.

Figure 4:
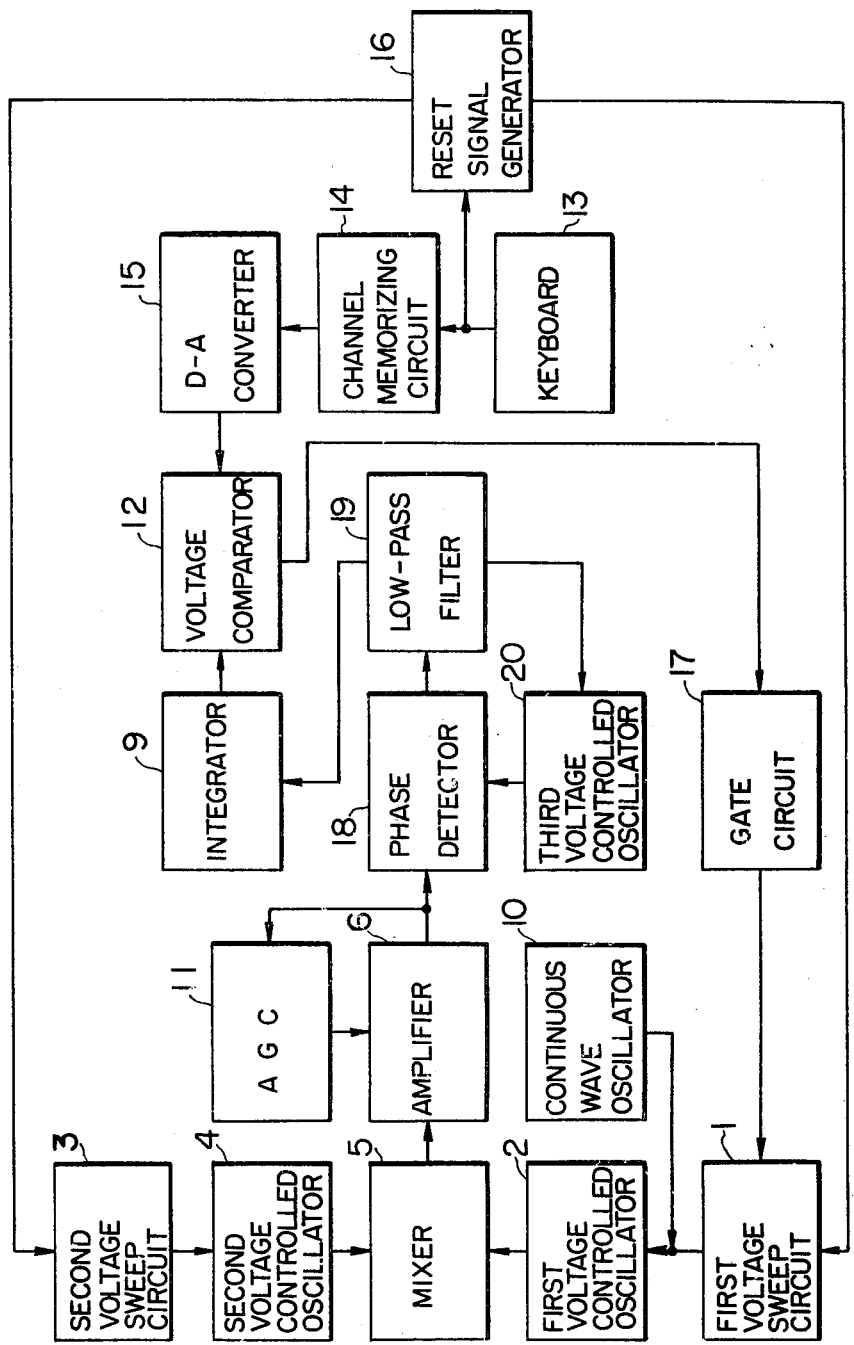
FIGS. 4 and 5 are block diagrams showing other embodiments of the sweep output generator.

In the construction of FIG. 1 as has been mentioned, it is necessary that there be perfect tracking between the output frequencies of the first and second voltage controlled oscillators 2 and 4. To this end, the second voltage sweep circuit 3 may be controlled through a gate circuit by frequency discriminating the output of the intermediate frequency amplifier 6 for providing AFC to the second voltage controlled oscillator 4 at a constant frequency difference with respect to the first voltage controlled oscillator 2. Where the two oscillator output frequencies are deviated, a construction as shown in FIG. 4 is applicable. In FIG. 4, parts 1 to 6 and 9 to 17 have the same roles as those of like reference numerals in FIG. 1, so they are not described any further for the sake of brevity of the description. Here, the intermediate frequency output of the amplifier 6 is coupled to a phase detector 18, while the output of a third voltage controlled oscillator 20 is coupled to the other input terminal of the phase detector. Designated at 19 is a low-pass filter, whose output is coupled to the third voltage controlled oscillator 20. The phase detector 18, low-pass filter 19 and voltage controlled oscillator 20 constitute a phase locked loop such that the oscillation of the voltage controlled oscillator 20 is phase locked to the intermediate frequency output of the amplifier 6. When this phase locked loop is operated for the operation of the parts 1 to 6 and 9 to 17 in the manner as mentioned in connection with FIG. 1, the error signal of the phase locked loop, obtained from the low-pass filter 19, constitutes the frequency modulated wave. Thus, linear display of the tuning frequency, digital display of the channel number and electronic tuning through digital control may be obtained in the manner mentioned in connection with FIG. 1 even if there is no perfect tracking between the first and second voltage controlled oscillators 2 and 4 provided there is tracking within the band of the intermediate frequency amplifier 6.

Figure 5:
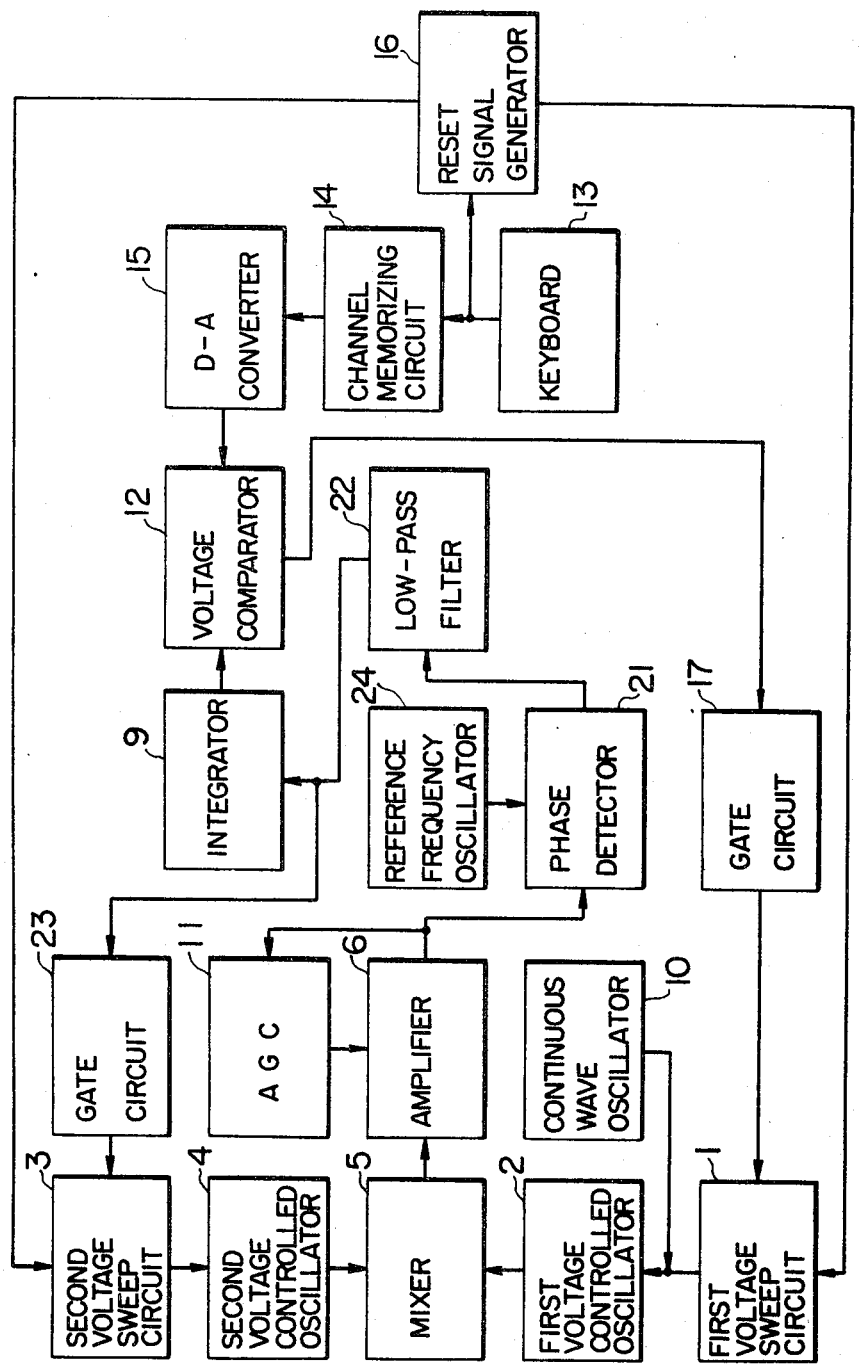

FIG. 5 shows a system, which is an improvement over the systems of FIGS. 1 and 4 and enables perfect tracking between the two voltage controlled oscillators 2 and 4 and frequency demodulation. In the Figure, parts 1 to 6 and 9 to 17 have the same roles as those of like reference numerals in FIG. 1. Designated at 21 is a phase detector, at 22 a low-pass filter, at 23 a gate circuit for controlling the second voltage sweep circuit 3 with the output of the low-pass filter 22, and at 24 a reference frequency oscillator for the phase detector 21. Here, a phase locked loop is constituted by parts 21, 22, 23, 3, 4, 5 and 6, with the frequency sweep in the second voltage controlled oscillator 4 phase locked to that in the first voltage controlled oscillator. By operating parts 1 to 6 and 9 to 17 in the manner described in connection with FIG. 1, the error signal of the phase locked loop, as obtained from the low-pass filter 22, constitutes the frequency demodulated wave. Thus, linear display of the tuning frequency, digital display of the channel number and electronic tuning through the digital control may be obtained in the manner mentioned in connection with FIG. 1.

Figure 6:
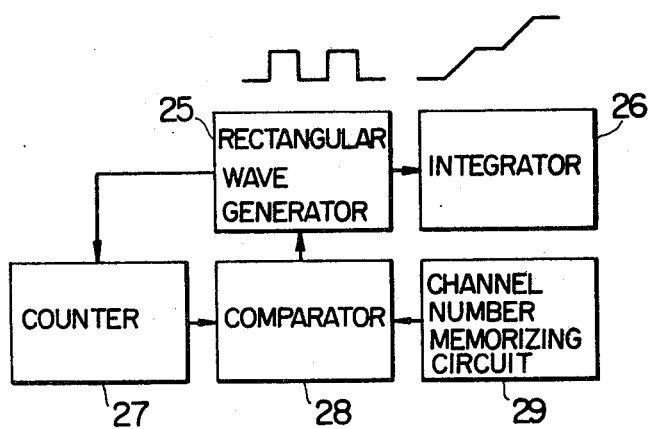
FIG. 6 is a block diagram showing a part of the sweep output generators shown in FIGS. 4 and 5.
Figure 7:
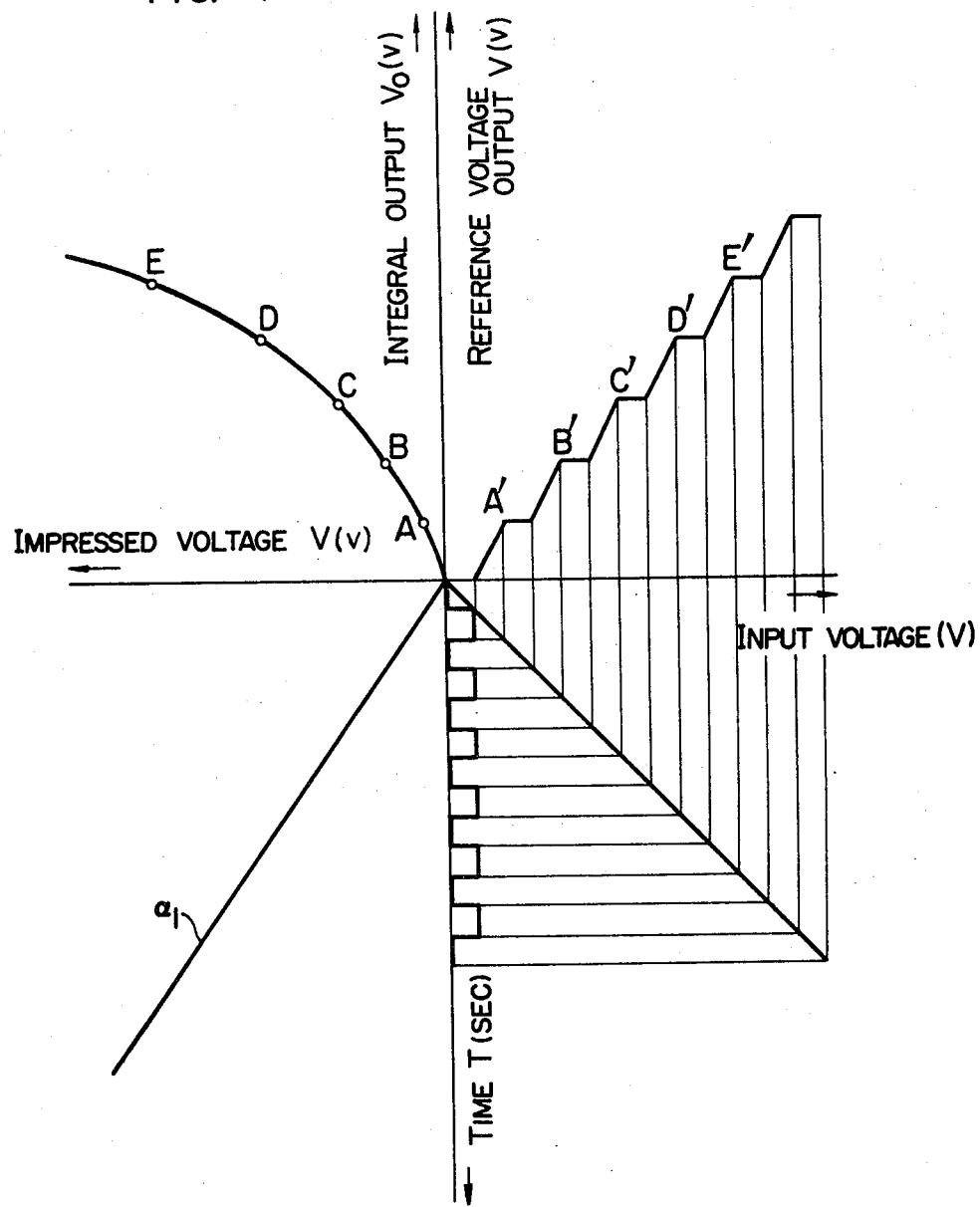
FIG. 7 is a graph for illustrating the characteristic of the sweep output generators of FIGS. 4 and 5.

The digital-to-analog converter may be of the ordinary type where voltage or current elements for $2^0$, $2^1$, ..., $2^n$ are controlled with a binary input signal. As a more inexpensive and accurate substitute for it, it is possible to use a circuit, in which a stair-case sweep voltage is produced by coupling a rectangular voltage to an integrator. In this case, the sweep is stopped according to an input signal, and the voltage at this instant is held for a required period. FIG. 6 shows a block diagram of such a circuit, and FIG. 7 compares the reference output voltage of this digital-to-analog converter and the integral output $V_0$ in FIG. 3. In FIG. 6, the output of a rectangular wave generator 25 is integrated by an integrator 26 to obtain a stair-case sweep voltage. Here, to determine the number of steps for the stopping of the sweep, the output of a comparator 28 comparing the content of a counter 27 counting the output of the rectangular wave generator 25 and the content of a channel number memorizing circuit 29 is used to control the generator 25.

In FIG. 7, values of the integral output $V_0$ at points A, B, C, D and E correspond to the respective step voltages A', B', C', D' and E' of the reference voltage output. In Japan, the television channels in the lower VHF band and higher UHF band are spaced at a constant interval of 6 MHz, so that the individual points A, B, C, D and E may be spaced with respect to the axis of the impressed voltage at a constant interval so that they correspond to the local oscillation frequencies for the respective channels. In the higher VHF band, there is a gap of 4 MHz between channels 7 and 8, so that the spacing between adjacent points A, B, C, . . . , may be made to correspond to a frequency interval of 2 MHz, while multiplying the content of the channel number memorizing circuit 29 in FIG. 6 by 3. In the relation of FIG. 7, the slope $\alpha_1 = \Delta V/\Delta T$ of the impressed voltage $V$ versus time $T$ characteristic has to be smaller to such an extent that the integral output voltages A, B, C . . . , are produced after obtaining the reference voltages A', B', C', . . . .

As has been described, an a-c voltage of a very small amplitude is impressed in superimposition upon the sweep voltage upon the variable reactance element of the first voltage controlled oscillator, i.e., the local sweep oscillator, for the sweeping of the local oscillator frequency and frequency modulation, and the output of the local sweep oscillator and the output of the second voltage controlled oscillator are added to the mixer for obtaining an intermediate frequency signal coupled to the frequency discriminator for frequency demodulation, the frequency demodulation output being integrated for obtaining a sweep output voltage of a characteristic similar to a normalized local oscillation frequency versus impressed voltage characteristic to thereby enable linear display of the reception frequency, digital display of the received channel and electronic tuning through digital control.

Also, even if perfect tracking between the first and second voltage controlled oscillators is not obtained, similar effects may be obtained by forming a phase locked loop with a phase detector receiving the intermediate frequency output and the output of a third voltage controlled oscillator and producing an output coupled through a low-pass filter to the third voltage controlled oscillator and frequency modulating the error signal of the phase locked loop.

Further, similar effects may be obtained by constituting a phase locked loop with a phase detector receiving the intermediate frequency output and a reference frequency oscillator output and producing an output coupled through a low-pass filter to the second voltage controlled oscillator to thereby completely phase lock the second voltage controlled oscillator to the first voltage controlled oscillator (i.e., providing for perfect tracking) and frequency demodulating the error signal of the phase locked loop.

Furthermore, digitally controlled electronic tuning permitting the linear display of the received channel or digital display of the received channel may be realized by an arrangement which compares the sweep output voltage $V_0$ similar in characteristic to a normalized local oscillation frequency versus impressed voltage characteristic and a digitally controlled digital-to-analog converter output in a voltage comparator and stops the sweep in the local oscillator when both the voltages coincides with each other.

Moreover, the above digital-to-analog converter may be inexpensively and accurately realized with a circuit so constructed as to produce a stair-case sweep voltage from a rectangular voltage added to an integrator, to stop the sweeping according to a station selection command digital signal and to hold the voltage at the instant of the stop for a required period.

What we claim is:

1. A sweep output generator for a station selector comprising:

a first electrically controlled oscillator including a variable reactance element, said oscillator having an oscillation frequency versus impressed voltage or current characteristic, means for applying a sweep signal to said first electrically controlled oscillator, a continuous oscillator for superimposing an a-c signal having an amplitude which is small compared to that of said sweep signal on said sweep signal for application to said variable reactance element, a frequency modulated sweep oscillation signal being generated at the output of said first electrically controlled oscillator, a second electrically controlled oscillator, mixer means combining the outputs of said first and second electrically controlled oscillators to produce an intermediate frequency signal, integrating means for integrating said demodulated intermediate frequency signal, the output of said integrating means having a sweep characteristic corresponding to the normalized oscillation frequency versus impressed voltage or current characteristic of said first electrically controlled oscillator, reference signal generating means for generating a reference signal corresponding to a station to be selected, comparison means for comparing the output of said integrating means with said reference signal, and means coupled to the output of said comparison means and to said first electrically controlled oscillator for terminating the sweep signal to said first electrically controlled oscillator when said compared voltages coincide, the desired station being thereby selected.

2. A sweep output generator according to claim 1, wherein said means for demodulating said intermediate frequency signal comprises a reference frequency oscillator, a phase detector having first and second inputs coupled to the outputs of said reference frequency oscillator and said mixer means respectively, and a low-pass filter coupling the output of said phase detector to said second controlled oscillator and said integrating means, said phase detector, low-pass filter, second controlled oscillator and mixer means comprising a phase locked loop for generating an error signal constituting said frequency modulated signal.

3. A sweep output generator according to claim 1, wherein said means for demodulating said intermediate frequency signal comprises a third electrically controlled oscillator, a phase detector having first and second inputs coupled to the output of said third electrically controlled oscillator and said mixer means respectively, and a low-pass filter coupling the output of said phase detector to said third electrically controlled oscillator and to said integrating means, said phase detector, low-pass filter and third electrically controlled oscillator comprising a phase locked loop for generating an error signal constituting said frequency modulated signal.

4. A sweep output generator according to claim 1, wherein said reference signal generating means comprises means for producing a voltage having a rectangular waveform, means for integrating said rectangular voltage to produce a stair-case sweep voltage, means for generating a station selection command input signal and means coupled to said rectangular voltage generating means and said station selection command generating means for terminating said rectangular voltage in accordance with said command input signal and holding said stair-case voltage at the level reached when said rectangular voltage is terminated.

* * * * *